US006815285B2

(12) United States Patent
Choi et al.

(10) Patent No.: US 6,815,285 B2
(45) Date of Patent: Nov. 9, 2004

(54) METHODS OF FORMING DUAL GATE SEMICONDUCTOR DEVICES HAVING A METAL NITRIDE LAYER

(75) Inventors: Gil-Heyun Choi, Gyeonggi-do (KR); Jong-Ho Lee, Gyeonggi-do (KR); Kyung-In Choi, Gyeonggi-do (KR); Byung-Hee Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/425,276

(22) Filed: Apr. 29, 2003

(65) Prior Publication Data

US 2004/0005749 A1 Jan. 8, 2004

(30) Foreign Application Priority Data

Jul. 2, 2002 (KR) ................................. 10-2002-0037852

(51) Int. Cl.[7] .......................................... H01L 21/8238
(52) U.S. Cl. ...................... 438/231; 438/275; 438/592; 438/659
(58) Field of Search ............................... 438/199, 231, 438/232, 275, 407, 528, 592, 655, 656, 659

(56) References Cited

U.S. PATENT DOCUMENTS 6,027,961 A * 2/2000 Maiti et al. ................. 438/592
6,139,922 A * 10/2000 Kaloyeros et al. ........... 438/683
6,376,888 B1 * 4/2002 Tsunashima et al. ......... 257/407
6,627,528 B1 * 9/2003 Ishimaru ..................... 438/231
2001/0015463 A1 * 8/2001 Wakabayashi et al. ....... 438/231

FOREIGN PATENT DOCUMENTS

JP          2001-217323          8/2001

OTHER PUBLICATIONS

Translation of Korean Office Action dated Apr. 29, 2004.

* cited by examiner

*Primary Examiner*—Chandra Chaudhari
(74) *Attorney, Agent, or Firm*—Myers Bigel Sibley & Sajovec

(57) ABSTRACT

A method for forming a dual gate includes providing a semiconductor substrate that has a first region of a first conductivity type and a second region of a second conductivity type. A gate insulating layer is formed on the semiconductor substrate. An initial metal nitride layer is formed on the gate insulating layer, opposite to the semiconductor substrate. Nitrogen ions are implanted into the initial metal nitride layer in the second transistor region to form a nitrogen-rich metal nitride layer. The initial metal nitride layer is patterned to form a first gate electrode in the first region. The nitrogen-rich metal nitride layer is patterned to form a second gate electrode in the second region. The work function of the nitrogen-rich metal nitride layer is higher than that of the initial metal nitride layer.

27 Claims, 7 Drawing Sheets

METHODS OF FORMING DUAL GATE SEMICONDUCTOR DEVICES HAVING A METAL NITRIDE LAYER

RELATED APPLICATION

This application claims the benefit of Korean Patent Application No. 2002-0037852, filed Jul. 2, 2002, the disclosure of which is hereby incorporated herein by reference in its entirety as if set forth fully herein.

FIELD OF THE INVENTION

The present invention relates to methods of forming semiconductor devices and, more particularly, to methods of forming dual gate semiconductor devices.

BACKGROUND OF THE INVENTION

A conventional transistor may include a gate electrode formed on an active region of a semiconductor substrate, a gate insulating layer interposed between the gate electrode and the substrate, and source/drain areas formed in an active region adjacent to opposite sides of the gate electrode. The gate insulating layer may be a silicon oxide layer, such as a thermal oxide, and the gate electrode may be doped polysilicon.

With trends toward increased integration of semiconductor devices, gate insulating layer thickness and wiring widths are likely to continue to decrease. Decreased gate insulating layer thickness may lead to increased leakage current, and reduced wiring widths may lead to increased resistance of the gate electrode.

Attempts to suppress leakage current have been made. In one such attempt, a gate insulating layer was formed from a high-k dielectric material, compared to a typical silicon oxide. It may thereby be possible to form a gate insulating layer having a greater thickness, compared to a gate insulating layer of silicon oxide, which may suppress a leakage current.

Attempts to suppress increases in the resistance of the gate electrode have also been made. In one such attempt, a gate electrode was formed from a metal having a lower resistivity than doped polysilicon. Unfortunately, when such a metal gate electrode is formed on a high-k dielectric layer, the metal layer may be oxidized by the high-k dielectric layer, and associated transistor characteristics may be deteriorated.

Transistors in semiconductor devices may be classified as NMOS transistors and PMOS transistors based upon the main carriers that migrate through their channel. The main carriers of the NMOS transistor are electrons, and those of the PMOS transistor are holes. A work function of a PMOS gate electrode in a PMOS transistor is higher than that of an NMOS gate electrode in a NMOS transistor. The different work functions of PMOS and NMOS transistors may increase their fabrication complexity.

A conventional method of forming a dual gate is explained with reference to FIGS. 1–3. Referring to FIG. 1, a process well known in the art may be used to form device isolation layers 2, and P-type and N-type active regions 3 and 4 defined by the device isolation layers 2. An NMOS gate insulating layer 5 and an NMOS gate electrode layer 6 are sequentially stacked on a semiconductor substrate 1 having the P-type and N-type active regions 3 and 4.

Referring to FIG. 2, the NMOS gate electrode layer 6 and the NMOS gate insulating layer 5 are successively patterned to form an NMOS gate electrode 6a. The NMOS gate electrode 6a is disposed over the P-type active region 3. A PMOS gate insulating layer 7 and a PMOS gate electrode layer 8 are sequentially stacked on the semiconductor substrate 1 and the NMOS gate electrode 6a. A work function of the PMOS gate electrode layer 8 is higher than that of the NMOS gate electrode 6.

Referring to FIG. 3, the PMOS gate electrode layer 8 and the PMOS gate insulating layer 7 are successively etched to form a PMOS gate electrode 8a over the N-type active region 4. The NMOS gate electrode 6a may become damaged, thereby deteriorating one or more characteristics of an NMOS transistor formed therewith.

When the NMOS and PMOS gate electrodes 6a and 8a are formed using a damascene process (not shown), the fabrication process may become more complex.

A method of forming a dual gate electrode that may be used in a CMOS circuit is disclosed in U.S. Pat. No. 6,027,961, entitled "CMOS SEMICONDUCTOR DEVICES AND METHOD OF FORMATION" to Maiti et al. As disclosed, a gate insulating layer and a tantalum layer are sequentially formed over a semiconductor substrate. Nitrogen ions are selectively implanted into a tantalum layer on a PMOS transistor region to form a first tantalum nitride layer. The nitrogen ions are selectively implanted into a tantalum layer over an NMOS transistor region to form a second tantalum nitride layer whose work function is lower than that of the first tantalum nitride layer. Because a lower side of the tantalum layer contacts the gate insulating layer, the lower side may be oxidized during an annealing process for activating the nitrogen ions. As a result, the characteristic of a transistor may be deteriorated.

Another method of forming a dual gate electrode that may be used in a CMOS circuit is disclosed in Japanese Laid-open Patent No. 2001-217323. As disclosed, a tantalum pentoxide ($Ta_2O_5$) layer is formed on a semiconductor substrate. Using a nitrogen plasma process, the tantalum pentoxide layer is nitrified to form a thin tantalum nitride layer on a surface of the tantalum pentoxide layer. There is a restriction that the gate insulating layer must be made of a tantalum-containing insulator. Moreover, there is a limitation on an increase in the thickness of the tantalum nitride layer. However, if the thickness of the tantalum nitride layer is not sufficient, it may be difficult to obtain acceptable transistor characteristics because of a work function of the tantalum nitride layer.

SUMMARY OF THE INVENTION

A method for forming a dual gate is provided according to embodiments of the present invention. A semiconductor substrate is provided that has a first region of a first conductivity type and a second region of a second conductivity type. A gate insulating layer is formed on the semiconductor substrate. An initial metal nitride layer is formed on the gate insulating layer, opposite to the semiconductor substrate. Nitrogen ions are implanted into the initial metal nitride layer in the second transistor region to form a nitrogen-rich metal nitride layer. The initial metal nitride layer is patterned to form a first gate electrode in the first region. The nitrogen-rich metal nitride layer is patterned to form a second gate electrode in the second region. The work function of the nitrogen-rich metal nitride layer is higher than that of the initial metal nitride layer.

According to further embodiments of the present invention, the first region may be an NMOS transistor region, the second region may be a PMOS transistor region, the first gate electrode may be an NMOS transistor gate electrode, and the second gate electrode may be a PMOS transistor gate electrode. The initial metal nitride layer may be patterned at the same time as (concurrent with) the nitrogen-rich metal nitride layer. The gate insulating layer may be formed from a high-k dielectric material whose dielectric constant is greater than that of silicon oxide. A silicate layer may be formed on the semiconductor substrate before the gate insulating layer is formed.

According to yet further embodiments, the metal layer and the initial metal nitride layer may be patterned to form an initial metal nitride layer pattern and a first metal layer pattern that are stacked in the first transistor region, and the metal layer and the nitrogen-rich metal nitride layer may be patterned to form a nitrogen-rich metal nitride layer pattern and a second metal layer pattern that are stacked in the second transistor region.

According to other embodiments of the present invention, a method of forming a dual gate includes providing a semiconductor substrate having a first region of a first conductivity type and a second region of a second conductivity type. A mold insulating layer is formed on the semiconductor substrate. The mold insulating layer is patterned to form a first gate groove in the first region of the semiconductor substrate and to form a second gate groove in the second region of the semiconductor substrate. A gate insulating layer is formed on the semiconductor substrate and the first and second gate grooves. An initial metal nitride layer is formed on the gate insulating layer, opposite to the semiconductor substrate, and filling the first and second gate grooves. The initial metal nitride layer is planarized to form a first gate electrode in the first gate groove and a backup second gate electrode in the second gate groove. Nitrogen ions are implanted into the backup second gate electrode to form a second gate electrode. A work function of the second gate electrode is higher than that of the first gate electrode.

According to further embodiments of the present invention, the first region may be an NMOS transistor region, the second region may be a PMOS transistor region, the first gate electrode may be an NMOS transistor gate electrode, and the second gate electrode may be a PMOS transistor gate electrode. A silicate layer may be formed on the semiconductor substrate and the first and second gate grooves, and the gate insulating layer may then be formed on the silicate layer. The gate insulating layer may be formed from a thermal oxide on the exposed areas of the first and second transistor regions. The backup second gate electrode may be annealed after the nitrogen ions are implanted. The gate insulating layer and the mold insulating layer may be anisotropically etched, using the first and second gate electrodes as masks, after the nitrogen ions have been implanted into the backup second gate electrode.

DETAILED DESCRIPTION

Figure 1:
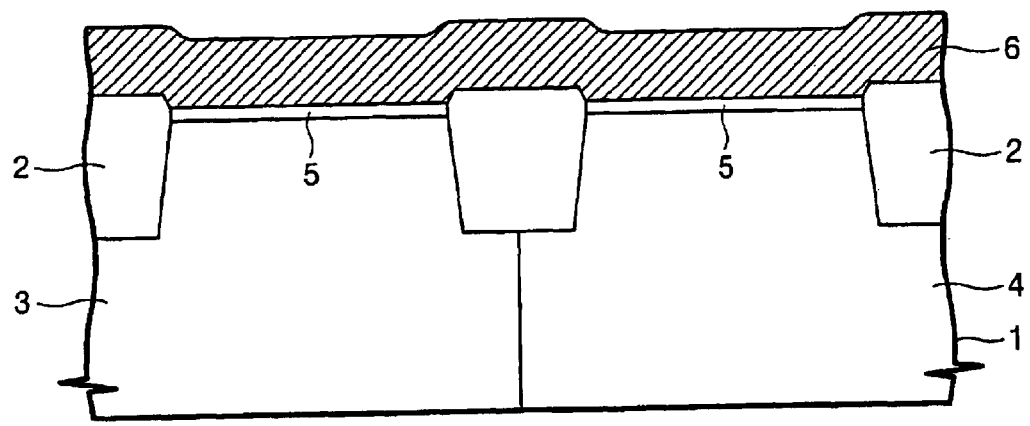
FIG. 1 through FIG. 3 are cross-sectional views of a process for fabricating a conventional dual gate.
Figure 2:
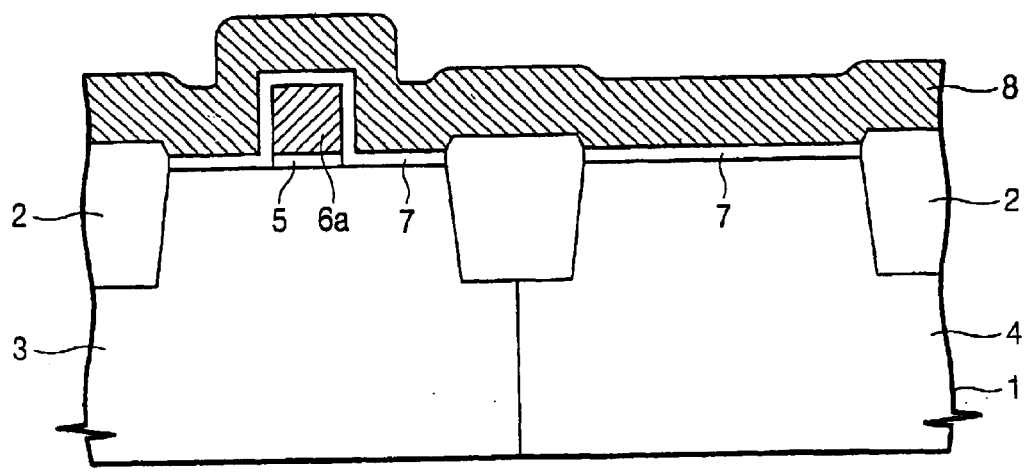
Figure 3:
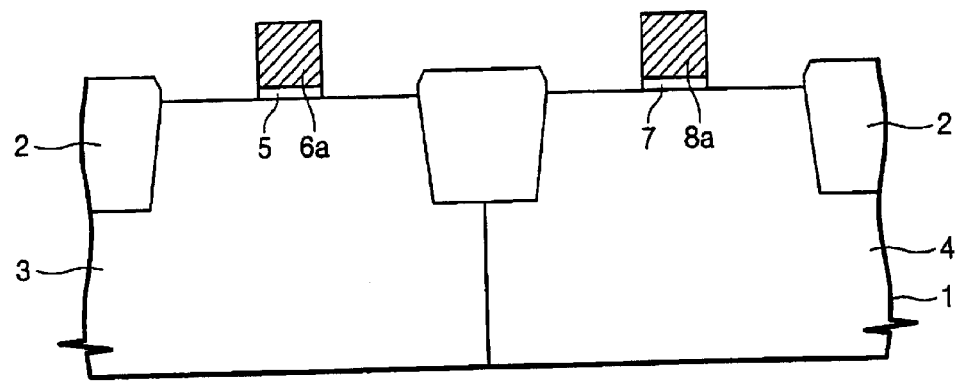

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Some embodiments of the present invention are discussed below with reference to FIGS. 4–8, while some other embodiments of the present invention are discussed with reference to FIGS. 9–13. For purposes of illustration only, these embodiments are discussed with reference to "NMOS" and "PMOS", and "N-type" and "P-type" conductivity. However, it is to be understood that the references to "NMOS" and "PMOS" may be swapped for each other, and the references to "N-type" and "P-type" may correspondingly be swapped for each other. Accordingly, in some embodiments of the present invention, the dual gate transistors are as illustrated in FIGS. 4–8 and 9–13 and are formed as described herein, except that all references to "NMOS" are replaced by "PMOS", all references to "PMOS" are replaced by "NMOS", and likewise all references to "N-type" and P-type" are swapped. Moreover, for convenience of description, one of the two "NMOS" and "PMOS" terms is referred to as a "first" type and the other one of the two "NMOS" and "PMOS" types is referred to as a "second" type.

A process for fabricating a dual gate of a semiconductor device according to embodiments of the present invention is discussed with reference to FIGS. 4–8, in which reference symbols "a" and "b" represent an NMOS transistor region and a PMOS transistor region, respectively.

Figure 4:
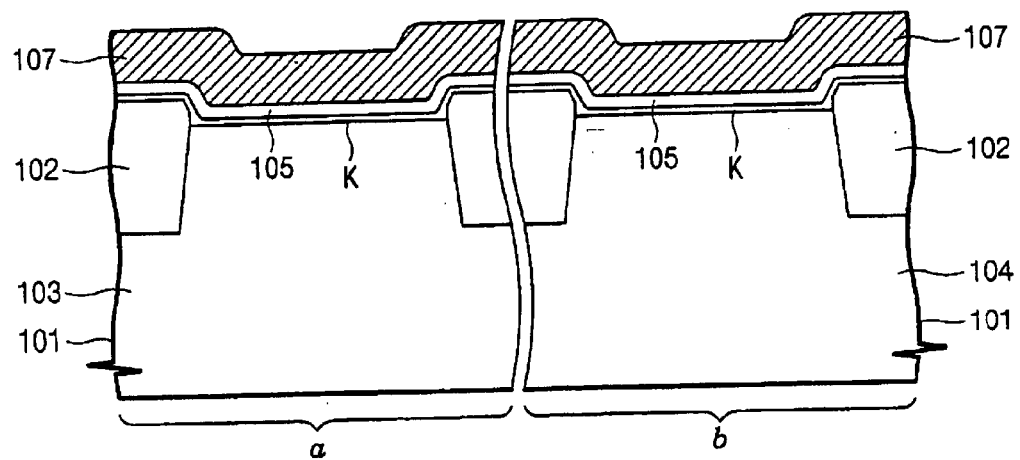
FIG. 4 through FIG. 8 are cross-sectional views of a process for fabricating a dual gate of a semiconductor device according to embodiments of the present invention.

Referring to FIG. 4, device isolation layers 102 are formed in a semiconductor substrate 101 to define active regions. A P-type active region 103 is provided in the NMOS transistor region "a", and an N-type active region 104 is provided in the PMOS transistor region "b".

According to some embodiments of the present invention, the P-type and N-type active regions 103 and 104 may be formed by implanting P-type and N-type impurities, respectively, into the active regions. According to other embodiments of the present invention, the device isolation layers 102 may be formed in a P-type semiconductor substrate 101 to define a P-type active region 103, and then N-type impurities may be implanted into the region "b" to form the N-type active region 104. According to yet other embodiments, P-type impurities may be implanted into an active region in region "a" in an N-type semiconductor substrate 101 to form the P-type active region 103.

A silicate layer K, a gate insulating layer 105, and an initial metal nitride layer 107 may be sequentially stacked on the semiconductor substrate 101 and the NMOS and PMOS transistor regions "a" and "b". The gate insulating layer 105 may be formed from a high-k dielectric material whose dielectric constant is greater than that of silicon oxide. The gate insulating layer 105 may be from at least one selected from the group consisting of tantalum oxide ($Ta_2O_5$), titanium oxide ($TiO_2$), hafnium oxide ($HfO_2$), zirconium oxide ($ZrO_2$), aluminum oxide ($Al_2O_3$), and yttrium oxide ($Y_2O_3$).

The silicate layer K is an insulating layer that may prevent the gate insulating layer 105 from reacting with the semiconductor substrate 101 and forming a silicate layer. The silicate layer K may be formed have less thickness than a silicate layer that, but for the silicate layer K, would be formed by the reaction of the gate insulating layer 105 and the semiconductor substrate 101 during an annealing process. According to some embodiments, the gate insulating layer 105 may be formed from hafnium oxide (HfO$_2$) and the silicate layer K may be formed from hafnium silicate oxide (HfSiOx). A thickness of the hafnium silicate oxide (HfSiOx) of the silicate layer K may be formed to have less thickness than that of a hafnium silicate oxide layer which would be formed if the hafnium oxide (HfO$_2$), of the gate insulating layer 105, were to react with the semiconductor substrate 101 during a subsequent annealing process.

The initial metal nitride layer 107 may have a better oxidation-resistance than a metal layer without nitride. Consequently, it may be possible to prevent the initial metal nitride layer 210 from reacting with the gate insulating layer 105 in a conventional nitrification process. For example, when the initial metal nitride layer 210 is formed from tantalum nitride, oxidation of the tantalum by the gate insulating layer 105 may be reduced. The initial metal nitride layer 107 may have a lower resistivity than a doped polysilicon layer.

The initial metal nitride layer 107 may be formed from tantalum nitride (TaN), titanium nitride (TiN), and/or tungsten nitride (WN).

The initial metal nitride layer 107 may be formed using a chemical vapor deposition (CVD) technique or an atomic layer deposition (ALD) technique. When the initial metal nitride layer 107 is formed using the CVD or ALD technique, it may be formed by a tantalum precursor that is selected from at least one of the group consisting of tantalum fluoride (TaF$_5$), tantalum iodide (TaI$_5$), tantalum bromide (TaBr$_5$), tantalum chlorine (TaClx), Ta(NEt$_2$)$_5$, Ta(NMe$_2$)$_5$, and t-butylimido-tris(diethylamido) tantalum (TBTDET). The initial metal nitride layer 107 may also be formed using a sputtering technique.

Figure 5:
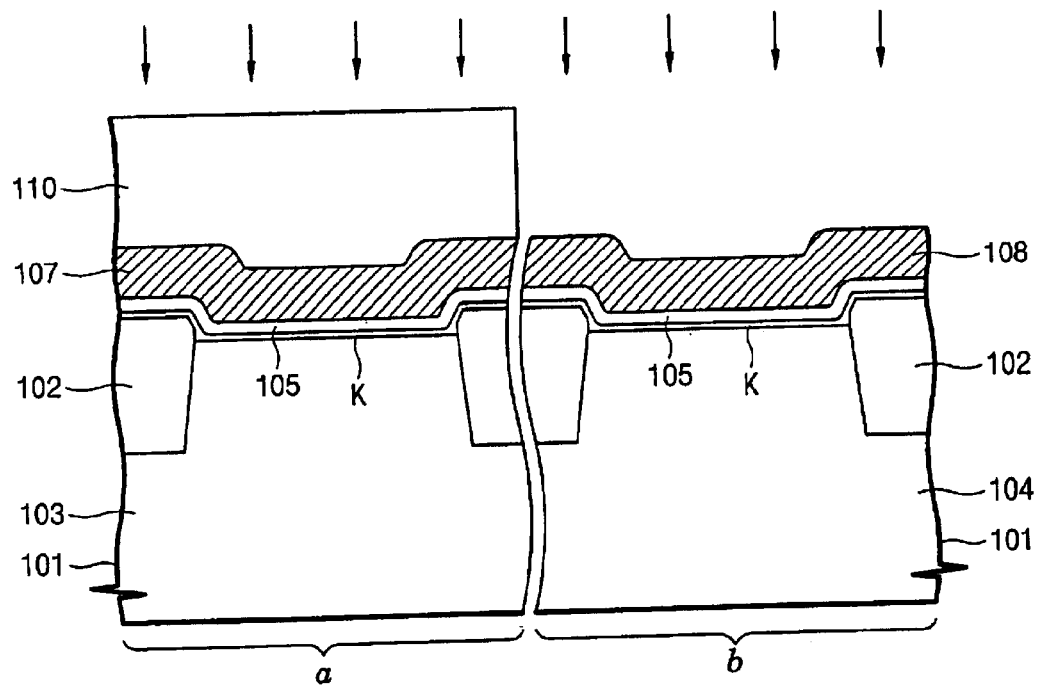

Referring to FIG. 5, a photoresist pattern 110 may be formed on the initial metal nitride layer 107, and patterned to expose the initial metal nitride layer 107 in the PMOS transistor region "b". Nitrogen ions are implanted into the exposed initial metal nitride layer 107 to form a nitrogen-rich metal nitride layer 108. In forming the nitrogen-rich metal nitride layer 108, it may be desirable that after implanting nitrogen ions, an annealing process is carried out to activate the initial metal nitride layer 107 into which the nitrogen ions are implanted.

A work function of a metal nitride layer generally becomes higher in proportion to the concentration of nitrogen. Accordingly, a work function of the nitrogen-rich metal nitride layer 108 is higher than that of the initial metal nitride layer 107.

Figure 6:
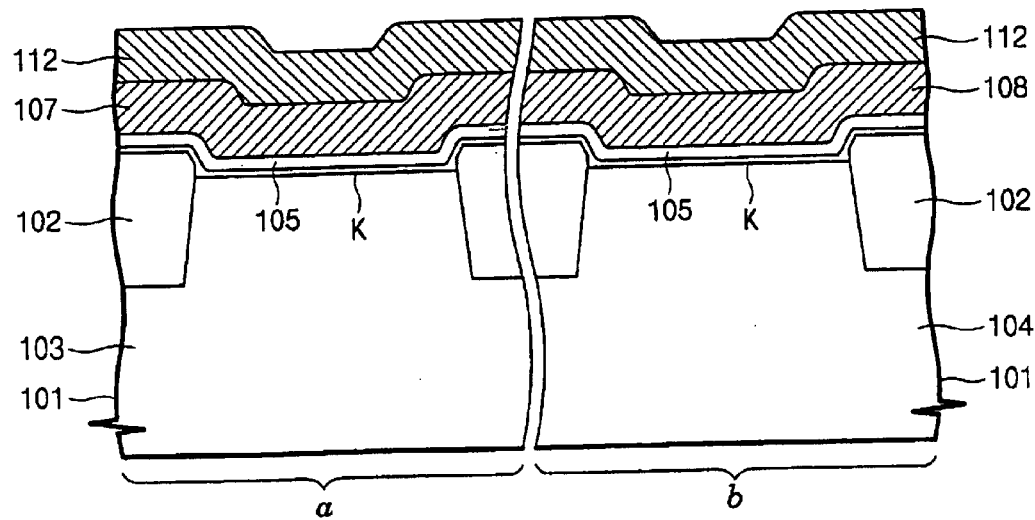

Referring to FIG. 6, after the photoresist pattern 10 is removed, a metal layer 112 may be formed on the metal nitride layer 107 and the nitrogen-rich metal nitride layer 108. The metal layer 112 may be formed from a conductor whose resistivity is lower than that of the initial metal nitride layer 107 and that of the nitrogen-rich metal nitride layer 108. The metal layer 112 may be formed from at least one of the group consisting of tungsten (W), tantalum (Ta), titanium (Ti), titanium silicide (TiSix), tungsten silicide (WSix), and a cobalt silicide (CoSix).

Figure 7:
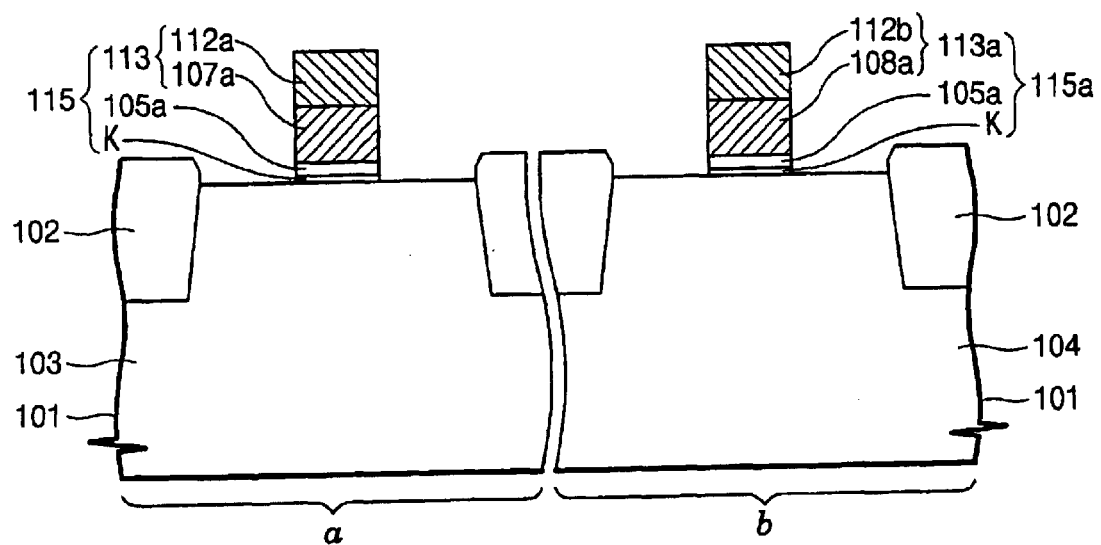

Referring to FIG. 7, the metal layer 112, the initial metal nitride layer 107, the gate insulating layer 105, and the silicate layer K are successively patterned to form an NMOS gate pattern 115 on the P-type active region 103. The NMOS gate pattern 115 includes the silicate layer K, a gate insulating layer pattern 105a, an initial metal nitride layer pattern 107a, and an NMOS metal layer pattern 112a which are sequentially stacked on the P-type active region 103. The initial metal nitride layer pattern 107a and the NMOS metal layer pattern 112a may form an NMOS gate electrode 113.

The metal layer 112, the nitrogen-rich metal nitride layer 108, the gate insulating layer 105, and the silicate layer K are successively patterned to form a PMOS gate pattern 115a on the N-type active region 104. The PMOS gate pattern 115a includes the silicate layer K, a gate insulating layer pattern 105a, a nitrogen-rich metal nitride layer pattern 108a, a PMOS metal layer pattern 112b which are sequentially stacked on the N-type active region 104. The nitrogen-rich metal nitride layer pattern 108a and the PMOS metal layer pattern 112b may form a PMOS gate electrode 113a.

The PMOS and NMOS gate patterns 115 and 115a may be formed at the same time.

By implanting nitrogen ions into the initial metal nitride layer 107 to form the nitrogen-rich metal nitride layer 108, and by forming the NMOS and PMOS gate patterns 115 and 115a at the same time (concurrent with), the process for forming the dual gate may be simplified compared to a conventional process and the yield of the dual gate semiconductor device may be enhanced.

Figure 8:
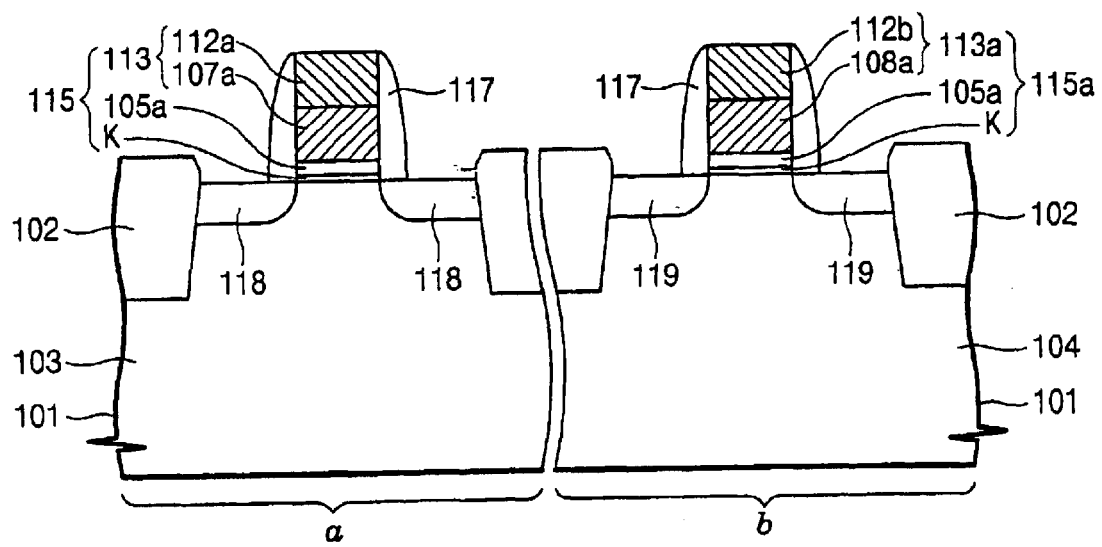

Referring to FIG. 8, a spacer 117 may be formed on both sidewalls of the NMOS and PMOS gate patterns 115 and 115a. N-type impurity ions may be implanted into P-type active regions 103 adjacent to opposite sides of the NMOS gate pattern 115 to form NMOS source/drain regions 118. P-type impurity ions may be implanted into N-type active regions 104 adjacent to opposite sides of the PMOS gate pattern 115a to form PMOS source/drain regions 119.

Other embodiments of the present invention for forming a dual gate are illustrated and discussed with reference to FIGS. 9–13, in which reference symbols "c" and "d" represent an NMOS transistor region and a PMOS transistor region, respectively.

Figure 9:
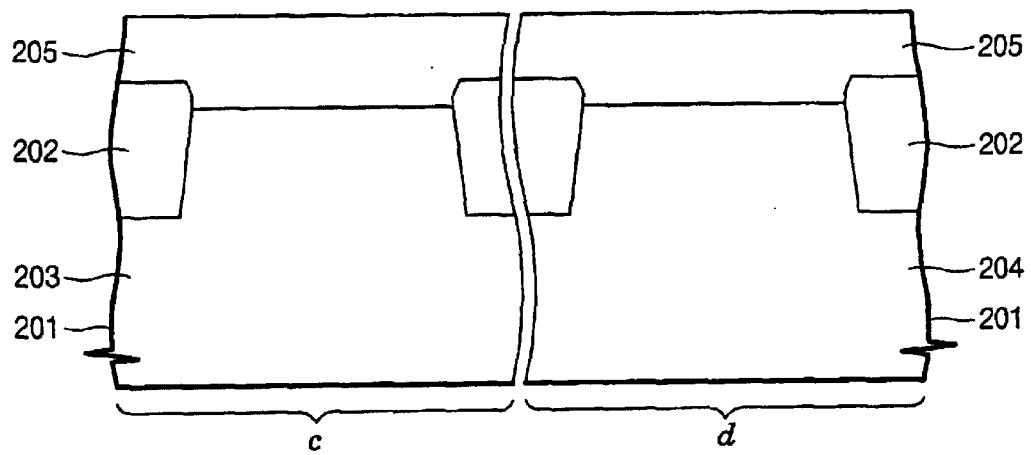
FIG. 9 through FIG. 13 are cross-sectional views of a process for fabricating a dual gate of a semiconductor device according to other embodiments of the present invention.

Referring to FIG. 9, device isolation layers 202 are formed in a semiconductor substrate 201 to define active regions. A P-type active region 203 is formed in NMOS transistor region "c", and an N-type active region 204 is formed in PMOS transistor region "d". The P-type and N-type active regions 203 and 204 may be formed as was discussed with respect to FIG. 4. A mold insulating layer 205 is formed on the semiconductor substrate having the NMOS and PMOS transistor regions "c" and "d". The mold insulating layer may be formed from CVD silicon oxide.

Figure 10:
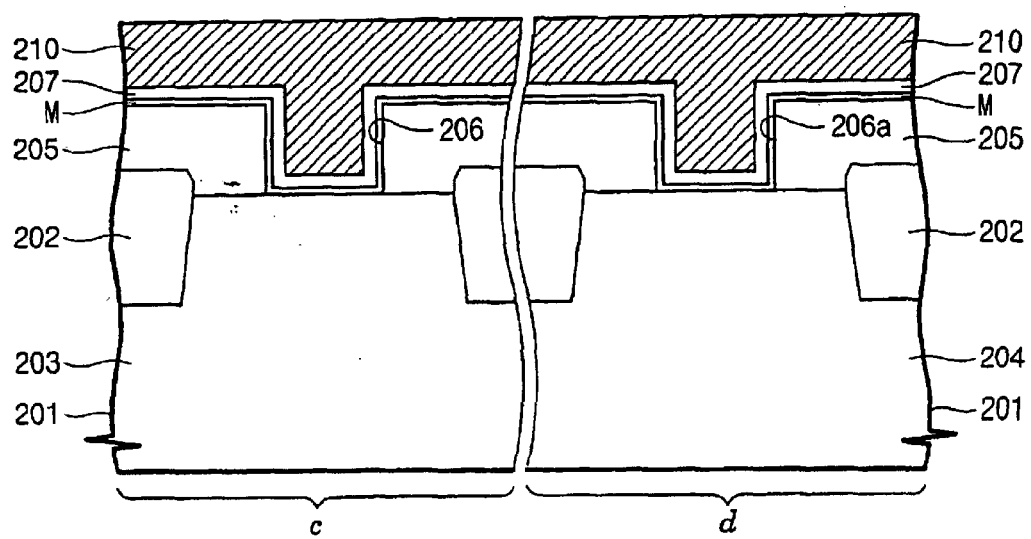

Referring to FIG. 10, the mold insulating layer 205 is patterned to form an NMOS gate groove 206 exposing an area of the P-type active region 203 and to form a PMOS gate groove 206a exposing an area of the N-type active region 204. A silicate layer M may be formed on an entire surface, or a portion of the surface, of the semiconductor substrate 201 including the NMOS and PMOS gate grooves 206 and 206a. A gate insulating layer 207 may be formed on the silicate layer M. According to other embodiments of the present invention, the silicate layer M may be omitted, and the insulating layer 207 may be formed on the semiconductor substrate 201. The gate insulating layer 207 may be formed from a high-k dielectric whose dielectric constant is larger than that of silicon oxide. The gate insulating layer 207 may be formed from at least one of the group consisting of tantalum oxide (Ta$_2$O$_5$), titanium oxide (TiO$_2$), hafnium oxide (HfO$_2$), zirconium oxide (ZrO$_2$), aluminum oxide ($Al_2O_3$), and yttrium oxide ($Y_2O_3$). The silicate layer M may prevent the gate insulating layer 207 from reacting with the semiconductor substrate 201 and forming a silicate layer. The silicate layer M may be formed in the manner described with regard to FIGS. 4–8.

The gate insulating layer 207 may be formed from silicon oxide, in which case the silicate layer M may not be needed. The gate insulating layer 207 may be formed by a thermal oxide of exposed surfaces of the P-type and N-type active regions 203 and 204.

An initial metal nitride layer 210 is formed on the gate insulating layer 207 and filling the NMOS and PMOS gate grooves 206 and 206a. The initial metal nitride layer 210 may have a better oxidation resistance for the gate insulating layer 207, compared to a metal layer without nitride. Thus, it may be possible to prevent the initial metal nitride layer 210 from reacting with the gate insulating layer 207 in a conventional nitrification process. The initial metal nitride layer 210 may have a lower resistivity than the doped polysilicon.

The initial metal nitride layer 210 may be formed from tantalum nitride (TaN), titanium nitride (TiN), and/or tungsten nitride (WN). The initial metal nitride layer 210 may be formed using a chemical vapor deposition (CVD) technique or an atomic layer deposition (ALD) technique. The initial metal nitride layer 210 may be formed from a tantalum precursor that is selected from at least one of the group consisting of tantalum fluoride ($TaF_5$), tantalum iodide ($TaI_5$), tantalum bromide ($TaBr_5$), tantalum chlorine ($TaCl_x$), $Ta(NEt_2)_5$, $Ta(NMe_2)_5$, and t-butylimido-tris (diethylamido) tantalum (TBTDET). The tantalum nitride layer may be formed using a sputtering technique.

Figure 11:
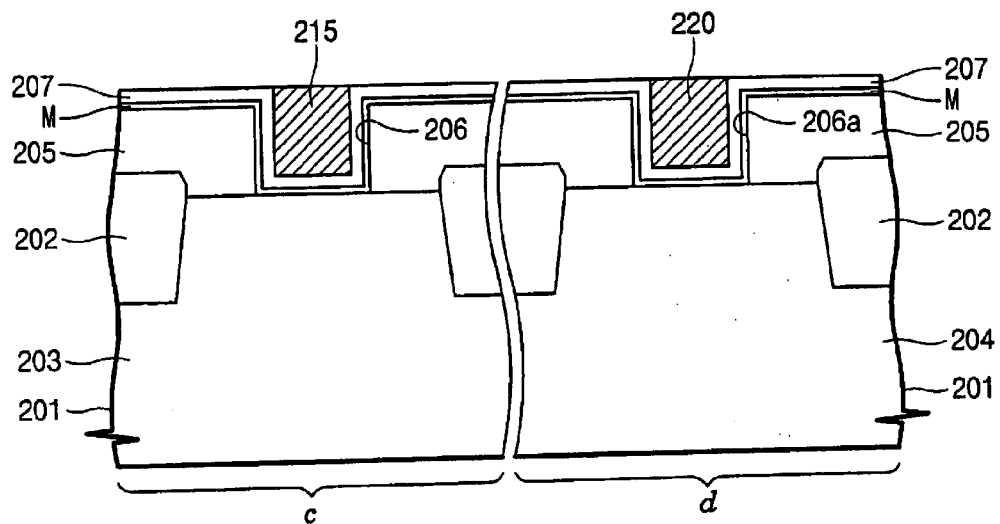

Referring to FIG. 11, the initial metal nitride layer 210 is planarized down to a top surface of the gate insulating layer 207, on the mold insulating layer 205, to form an NMOS gate electrode 215 in the NMOS gate groove 206 and to form a backup PMOS gate electrode 220 in the PMOS gate groove 206a. When the gate insulating layer 207 is formed from a thermal oxide, the initial metal nitride layer 210 may be planarized down to a top surface of the mold insulating layer 205.

Figure 12:
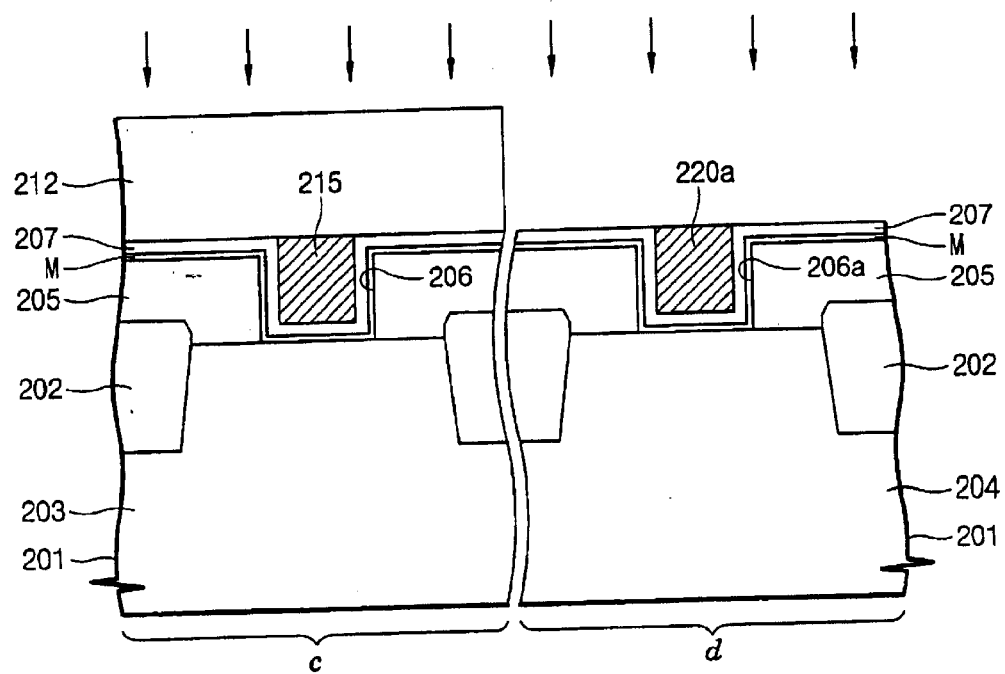

Referring to FIG. 12, a photoresist pattern 212 may be formed over a semiconductor substrate 201 including the gate electrodes 215 and 220, and patterned to expose the PMOS transistor region "d" and a top surface of the backup PMOS gate pattern 220. Using the photoresist pattern 212 as a mask, nitrogen ions are implanted into the exposed backup PMOS gate pattern 220 to form a PMOS gate electrode 220a having a nitrogen-rich metal nitride layer. As a result, a work function of the PMOS gate electrode 220a is higher than that of the NMOS gate electrode 215.

Figure 13:
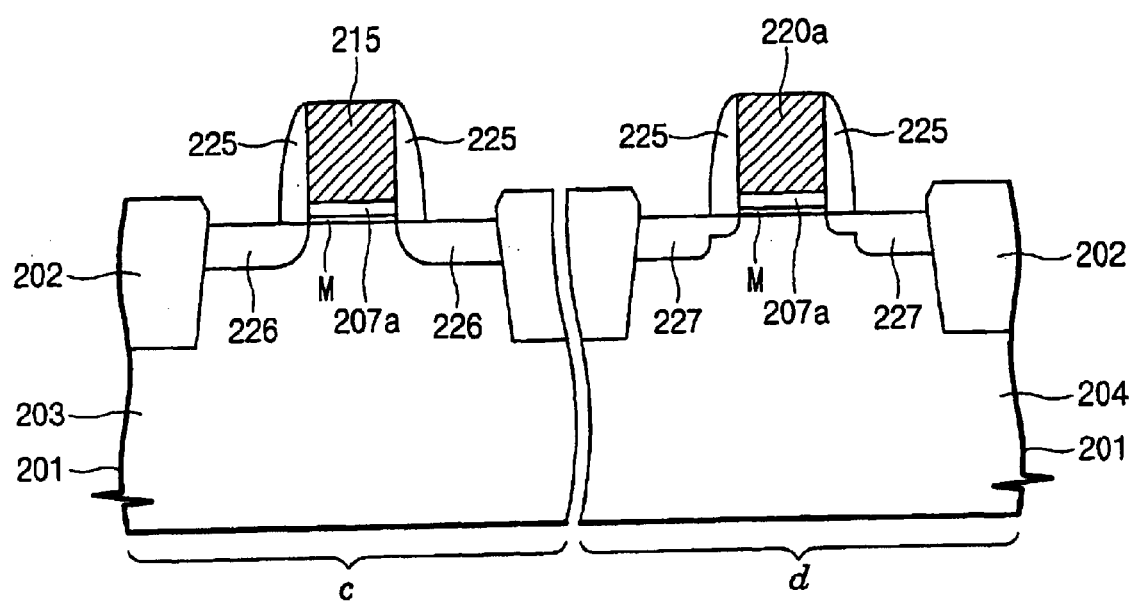

Referring to FIG. 13, following removal of the photoresist pattern 212, the exposed gate insulating layer 207, the silicate layer M, and the mold insulating layer 205 are anisotropically etched to be removed using the NMOS gate electrode 215 and the PMOS gate electrode 220a as masks. Gate insulating layer patterns 207a are thereby formed between the gate electrodes 215 and 220a and the active regions 203 and 204, respectively. A spacer 225 is formed on both sidewalls of the gate electrodes 215 and 220a. An NMOS source/drain region 226 is formed at P-type active regions 203 adjacent to opposite sides of the NMOS gate electrode 215. A PMOS source/drain region 227 is formed at N-type active regions 204 adjacent to opposite sides of the PMOS gate electrode 220a.

While this invention has been particularly shown and described with reference to embodiments thereof, it will be understood by those skilled in the art that various changes in form and details may be made therein without departing from the scope of the invention as defined by the appended claims.

What is claimed is:

1. A method of forming a dual gate, comprising:

providing a semiconductor substrate having an NMOS transistor region and a PMOS transistor region;

forming a gate insulating layer on the semiconductor substrate;

forming an initial metal nitride layer on the gate insulating layer, opposite to the semiconductor substrate;

implanting nitrogen ions into the initial metal nitride layer in the PMOS transistor region to form a nitrogen-rich metal nitride layer;

patterning the initial metal nitride layer to form an NMOS transistor gate electrode in the NMOS transistor region; and patterning the nitrogen-rich metal nitride layer to form a PMOS transistor gate electrode in the PMOS transistor region, wherein a work function of the nitrogen-rich metal nitride layer is higher than that of the initial metal nitride layer.

2. The method of claim 1 wherein the patterning of the initial metal nitride layer is concurrent with the patterning of the nitrogen-rich metal nitride layer.

3. The method of claim 1, wherein the gate insulating layer is formed from a high-k dielectric material whose dielectric constant is greater than that of silicon oxide.

4. The method of claim 3, wherein the forming a gate insulating layer and the forming an initial metal nitride layer are preceded by forming a silicate layer on the semiconductor substrate.

5. The method of claim 3, wherein the gate insulating layer is formed from at least one of the group consisting of tantalum oxide (Ta2O5), titanium oxide (TiO2), hafnium oxide (HfO2), zirconium oxide (ZrO2), aluminum oxide (Al2O3), and yttrium oxide (Y2O3).

6. The method of claim 1, wherein the gate insulating layer is formed from silicon oxide.

7. The method of claim 1, wherein the initial metal nitride layer is formed from tantalum nitride.

8. The method of claim 7, wherein the initial metal nitride layer is formed by at least one of chemical vapor deposition (CVD) and atomic layer deposition (ALD).

9. The method of claim 8, wherein the initial metal nitride layer is formed with at least one tantalum precursor that is selected from the group consisting of tantalum fluoride (TaF5), tantalum iodide (TaI5), tantalum bromide (TaBr5), tantalum chlorine (TaClx), Ta(NEt2)5, Ta(NMc2)5, and t-butylimido-tris(diethylamido) tantalum (TBTDET).

10. The method of claim 7, wherein the initial metal nitride layer is formed by a sputtering deposition.

11. The method of claim 1, further comprising annealing the initial metal nitride layer after the implanting nitrogen ions into the initial metal nitride layer in the PMOS transistor region.

12. The method of claim 1, further comprising forming a metal layer on the initial metal nitride layer and the nitrogen-rich metal nitride layer, wherein the metal layer is formed from a conductor having a lower resistivity than the initial metal nitride layer and the nitrogen-rich metal nitride layer.

13. The method of claim 12, wherein the metal layer is formed from at least one of the group consisting of tungsten (W), tantalum (Ta), titanium (Ti), titanium silicide (TiSix), tungsten silicide (WSix), and cobalt silicide (CoSix).

14. The method of claim 12, wherein:

the patterning the initial metal nitride layer comprises patterning the metal layer and the initial metal nitride layer to form an initial metal nitride layer pattern and a first metal layer pattern that are stacked in the NMOS transistor region; and the patterning the nitrogen-rich metal nitride layer comprises patterning the metal layer and the nitrogen-rich metal nitride layer to form a nitrogen-rich metal nitride layer pattern and a second metal layer pattern that are stacked in the PMOS transistor region, wherein the patterning the initial metal nitride layer and the patterning the nitrogen-rich metal nitride layer occur at the same time.

15. A method of forming a dual gate, comprising:

providing a semiconductor substrate having a first region of a first conductivity type and a second region of a second conductivity type;

forming a mold insulating layer on the semiconductor substrate;

patterning the mold insulating layer to form a first gate groove in the first region of the semiconductor substrate and to form a second gate groove in the second region of the semiconductor substrate;

forming a gate insulating layer on the semiconductor substrate and the first and second gate grooves;

forming an initial metal nitride layer on the gate insulating layer, opposite to the semiconductor substrate, wherein the initial metal nitride layer fills the first and second gate grooves;

planarizing the initial metal nitride layer to form a first gate electrode in the first gate groove and a backup second gate electrode in the second gate groove; and implanting nitrogen ions into the backup second gate electrode to form a second gate electrode, wherein a work function of the second gate electrode is higher than that of the first gate electrode.

16. The method of claim 15, wherein:

the first region is an NMOS transistor region;

the second region is a PMOS transistor region;

the first gate electrode is an NMOS transistor gate electrode; and the second gate electrode is a PMOS transistor gate electrode.

17. The method of claim 15, wherein the gate insulating layer is formed from a high-k dielectric whose dielectric constant is greater than that of silicon oxide.

18. The method of claim 17, wherein the forming a gate insulating layer is preceded by forming a silicate layer on the semiconductor substrate and the first and second gate grooves.

19. The method of claim 17, wherein the gate insulating layer is formed from at least one of the group consisting of tantalum oxide (Ta2O5), titanium oxide (TiO2), hafnium oxide (HfO2), zirconium oxide (ZrO2), aluminum oxide (Al2O3), and yttrium oxide (Y2O3).

20. The method of claim 15, wherein the gate insulating layer is formed from a thermal oxide from the exposed areas of the first and second transistor regions.

21. The method of claim 15, wherein the initial metal nitride layer is formed from tantalum nitride.

22. The method of claim 21, wherein the initial metal nitride layer is formed by at least one of chemical vapor deposition (CVD) and atomic layer deposition (ALD).

23. The method of claim 22, wherein the initial metal nitride layer is formed by a tantalum precursor that is selected from at least one of the group consisting of tantalum fluoride (TaF5), tantalum iodide (TaI5), tantalum bromide (TaBr5), tantalum chlorine (TaClx), Ta(NEt2)5, Ta(NMe2)5, and t-butylimido-tris(diethylamido) tantalum (TBTDET).

24. The method of claim 15, wherein the initial metal nitride layer is formed by a sputtering deposition.

25. The method of claim 15, further comprising annealing the backup second gate electrode, following the implanting nitrogen ions into the backup second gate electrode.

26. The method of claim 15, further comprising anisotropically etching the gate insulating layer and the mold insulating layer using the first and second gate electrodes as masks, following the implanting nitrogen ions into the backup second gate electrode.

27. The method of claim 4, wherein the silicate layer comprises hafnium silicate oxide.

* * * * *

UNITED STATES PATENT AND TRADEMARK OFFICE
CERTIFICATE OF CORRECTION

PATENT NO.    : 6,815,285 B2
DATED         : November 9, 2004
INVENTOR(S)   : Choi et al.

It is certified that error appears in the above-identified patent and that said Letters Patent is hereby corrected as shown below:

Column 8,
Line 51, should read -- tantalum chlorine (TaClx), Ta(Net2)5, Ta(Nme2)5, and --

Signed and Sealed this

First Day of March, 2005

JON W. DUDAS
*Director of the United States Patent and Trademark Office*